United States Patent
Kim

(10) Patent No.: US 7,084,568 B2
(45) Date of Patent: Aug. 1, 2006

(54) PLASMA DISPLAY DEVICE

(75) Inventor: Woo-Tae Kim, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 192 days.

(21) Appl. No.: 10/892,304

(22) Filed: Jul. 16, 2004

(65) Prior Publication Data

US 2005/0017638 A1 Jan. 27, 2005

(30) Foreign Application Priority Data

Jul. 22, 2003 (KR) .................. 10-2003-0050340

(51) Int. Cl.
 *H01J 17/00* (2006.01)
(52) U.S. Cl. ........................... 313/582; 313/44
(58) Field of Classification Search ............. 313/582, 313/11, 33, 44, 45
 See application file for complete search history.

(56) References Cited

U.S. PATENT DOCUMENTS

| | | | |
|---|---|---|---|
| 4,563,617 A * | 1/1986 | Davidson ............. 315/312 |
| 5,541,618 A | 7/1996 | Shinoda |
| 5,661,500 A | 8/1997 | Shinoda et al. |
| 5,663,741 A | 9/1997 | Kanazawa |
| 5,674,553 A | 10/1997 | Shinoda et al. |
| 5,724,054 A | 3/1998 | Shinoda |
| 5,786,794 A | 7/1998 | Kishi et al. |
| 5,952,782 A | 9/1999 | Nanto |
| 5,990,618 A | 11/1999 | Morita et al. |
| RE37,444 E | 11/2001 | Kanazawa |
| 6,353,288 B1 | 3/2002 | Asano et al. |
| 6,522,069 B1 | 2/2003 | Hong et al. |
| 6,545,410 B1 | 4/2003 | Wu et al. |
| 6,577,063 B1 | 6/2003 | Hsu et al. |
| 6,630,916 B1 | 10/2003 | Shinoda |
| 6,707,436 B1 | 3/2004 | Setoguchi et al. |
| 2003/0132710 A1 | 7/2003 | Kim |
| 2003/0171058 A1 | 9/2003 | Hirano et al. |
| 2003/0197469 A1 | 10/2003 | Kang et al. |
| 2004/0036413 A1 | 2/2004 | Bae et al. |

FOREIGN PATENT DOCUMENTS

| | | |
|---|---|---|
| JP | 02-148645 | 6/1990 |
| JP | 2845183 | 10/1998 |
| JP | 2917279 | 4/1999 |
| JP | 2001-043804 | 2/2001 |
| JP | 2001-325888 | 11/2001 |
| KR | 1998-0072077 | 10/1998 |

(Continued)

OTHER PUBLICATIONS

*Office Action* from the Korean Industrial Property Office issued in Applicant's corresponding Korean Patent Application No. 10-2003-0050340 dated Mar. 25, 2005 (English translation is attached).

(Continued)

*Primary Examiner*—Vip Patel
(74) *Attorney, Agent, or Firm*—Robert E. Bushnell, Esq.

(57) ABSTRACT

A plasma display device includes a plasma display panel having a front substrate and a rear substrate spaced apart from the front substrate to form a plurality of discharge spaces, and a chassis base facing the plasma display panel. The plasma display device includes at least one channel adapted to allow air to flow therethrough to improve heat removal efficiency, the at least one channel being arranged between the rear substrate and the chassis base.

27 Claims, 12 Drawing Sheets

FOREIGN PATENT DOCUMENTS

KR   2000-0033862   6/2000

OTHER PUBLICATIONS

"*Final Draft International Standard*", Project No. 47C/61988-1/Ed.1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

* cited by examiner

PLASMA DISPLAY DEVICE

CLAIM OF PRIORITY

This application makes reference to, incorporates the same herein, and claims all benefits accruing under 35 U.S.C. § 119 from an application for PLASMA DISPLAY DEVICE earlier filed in the Korean Intellectual Property Office on Jul. 22, 2003 and there duly assigned Serial No. 2003-50340.

BACKGROUND OF THE INVENTION

1. Field of the Invention

The present invention relates to a plasma display device, and more particularly, to a plasma display device including a channel to improve heat removal efficiency.

2. Description of the Related Art

Plasma display devices generally display an image using a discharge phenomenon and have high-quality display capacity, such as the number of displayable colors, brightness, contrast, afterimage, viewing angle, and the like. Since the plasma display devices are thin and enable large screen displays, they have come into the spotlight as devices capable of replacing CRTs.

Such a plasma display device generally includes a Plasma Display Panel (PDP) on which an image is displayed, a chassis base having a rear surface on which includes a circuit portion to drive the PDP, and a heat dissipating sheet interposed between the PDP and the chassis base.

The plasma display devices having the above-described structure display an image using a discharge phenomenon, which causes the PDP to generate a large amount of heat.

In order to remove the heat generated by the PDP, the heat dissipating sheet is attached to the entire surfaces of the PDP and the chassis base. As a result, the PDP has a heat removal structure which depends on heat conduction to the chassis base.

As is known, a non-uniform heat distribution can appear on the PDP which selectively discharges to display a gray scale. A solution for the non-uniform heat distribution has not been suggested, which results in a deterioration of the quality image. To be more specific, if temperature deviations of the PDP are not eliminated, a discharge cell in which a relatively large amount of heat has accumulated is deteriorated. Thus, a brightness difference occurs between the discharge cell in which the relatively large amount of heat has accumulated and a discharge cell in which a relatively large amount of heat has not accumulated. As a result, the overall brightness of the PDP deteriorates.

Also, a failure to eliminate temperature deviations on the PDP causes heat stress, which can cause the glass of the PDP to crack.

The chassis base can have an uneven portion due to the manufacture limitations. Since the heat dissipating sheet is not closely attached between the PDP and the chassis base due to the uneven portion, an air gap is formed. When the air gap is not removed during bonding of the PDP to the chassis base, the air gap reduces heat removal efficiency. Since the entire surface of the PDP adheres to the entire surface of the chassis base, an air gap is highly likely to be formed. Also, a discharge path for air is not secured during pressure bonding, and thus the air gap can remain.

Moreover, since heat generated by the PDP is mainly transmitted to the chassis base, the circuit portion on the chassis base can deteriorate.

The following patents each discloses features in common with the present invention but do not teach or suggest the inventive features specifically recited in the present application: U.S. Patent Application No. 2004/0036413 to Bae et al., entitled PASSIVE APPARATUS THAT REGULATES A FLOW OF HEATED AIR WITHIN A PLASMA DISPLAY DEVICE, published on Feb. 26, 2004; U.S. Patent Application No. 2003/0132710 to Kim, entitled IMAGE DISPLAY APPARATUS, published on Jul. 17, 2003; U.S. Patent Application No. 2003/0171058 to Hirano et al., entitled METHOD OF PRODUCING PLASMA DISPLAY DEVICES, published on Sep. 11, 2003; U.S. Patent Application No. 2003/0197469 to Kang et al., entitled PLASMA DISPLAY PANEL AND METHOD OF MANUFACTURING PARTITIONS THEREOF, published on Oct. 23, 2003; U.S. Pat. No. 6,577,063 to Hsu et al., entitled PLASMA DISPLAY PANEL ENABLED TO TIGHTLY COMBINE TWO PLATES TOGETHER AND THE METHOD FOR FABRICATING THE SAME, issued on Jun. 10, 2003; U.S. Pat. No. 5,990,618 to Morita et al., entitled PLASMA DISPLAY PANEL AND HEAT SINK, issued on Nov. 23, 1999; U.S. Pat. No. 6,353,288 to Asano et al., entitled PLASMA DISPLAY PANEL INCLUDING A COMPONENT PROVIDED BETWEEN FRONT AND BACK PLATES THEREOF, issued on Mar. 5, 2002; U.S. Pat. No. 6,522,069 to Hong et al., entitled PLASMA DISPLAY PANEL, issued on Feb. 18, 2003; and U.S. Pat. No. 6,545,410 to Wu et al., entitled FLAT PANEL DISPLAY OF A SEALING CHANNEL, issued on Apr. 8, 2003.

SUMMARY OF THE INVENTION

The present invention provides a plasma display device having an improved structure so as to enhance heat removal efficiency.

The present invention also provides a plasma display device in which heat distribution of a PDP can be uniform.

The present invention also provides a plasma display device in which an adhesive strength of a heat dissipating sheet can be enhanced.

The present invention also provides a plasma display device having an improved structure to efficiently protect a circuit portion from heat.

According to an aspect of the present invention, a plasma display device is provided comprising: a plasma display panel including a front substrate and a rear substrate spaced apart from the front substrate to form a plurality of discharge spaces; a chassis base facing the plasma display panel; and at least one channel adapted to allow air to flow therethrough, the at least one channel arranged between the rear substrate and the chassis base.

The plasma display device preferably further comprises a heat dissipating sheet interposed between the plasma display panel and the chassis base.

Preferably, the at least one channel is arranged between the rear substrate and the heat dissipating sheet.

Preferably, the at least one channel is arranged on a surface of the heat dissipating sheet facing the rear substrate.

Preferably, the at least one channel is arranged on a surface of the heat dissipating sheet facing the chassis base.

Preferably, the at least one channel is arranged on a surface of the rear substrate facing the chassis base.

Preferably, the at least one channel is arranged on a surface of the chassis base facing the plasma display panel.

Preferably, the at least one channel comprises at least one groove.

Preferably, the at least one groove is consecutively arranged to allow air to flow out.

Preferably, at least one side of the at least one groove is inclined at a predetermined angle with respect to a perpendicular direction of a surface on which the at least one groove is formed.

Preferably, the at least one groove is arranged in a serpentine or zigzag shape.

Preferably, a width of the at least one groove increases from an edge of a surface on which the at least one groove is arranged toward the center of the surface.

Preferably, the at least one groove is arranged in a predetermined pattern.

Preferably, the predetermined pattern is a stripe.

Preferably, the predetermined pattern is a lattice.

Preferably, at least one area increasing portion is arranged in the at least one channel to increase the surface area of the at least one channel.

Preferably, the at least one area increasing portion comprises an uneven surface.

According to another aspect of the present invention, a plasma display device is provided comprising: a plasma display panel including a front substrate and a rear substrate spaced apart from the front substrate to form a plurality of discharge spaces; a chassis base arranged at the rear of the plasma display panel; a circuit portion arranged at the rear of the chassis base; and at least one channel adapted to allow air to flow therethrough, the at least one channel arranged on the rear surface of the chassis base.

Preferably, the at least one channel comprises at least one groove.

Preferably, the at least one groove is consecutively arranged to allow air to flow in and out.

Preferably, the at least one groove is arranged in a serpentine or zigzag shape.

Preferably, a width of the at least one groove increases from an edge of the chassis base toward the center of the chassis base.

Preferably, the at least one groove is arranged in a predetermined pattern.

Preferably, the predetermined pattern is a stripe.

Preferably, the predetermined pattern is a lattice.

Preferably, area increasing portions are arranged in the at least one channel to increase the surface area of the at least one channel.

Preferably, the area increasing portions comprise uneven surfaces.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
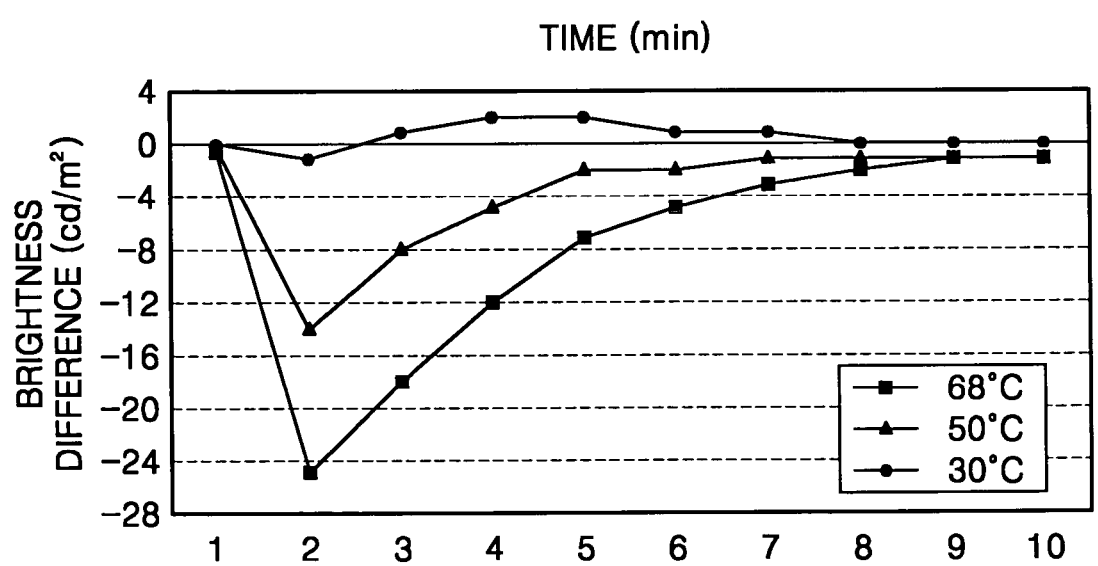
FIG. 1 is a profile of brightness differences depending on the temperature of a PDP.

FIG. 1 is a profile of brightness differences depending on a temperature of a PDP. As shown in FIG. 1, as the temperature of the PDP increases, the brightness difference between the discharge cell in which the relatively large amount of heat has accumulated and a discharge cell in which heat has not accumulated increases.

Hereinafter, exemplary embodiments of the present invention will be described in detail with reference to the attached drawings.

Figure 2:
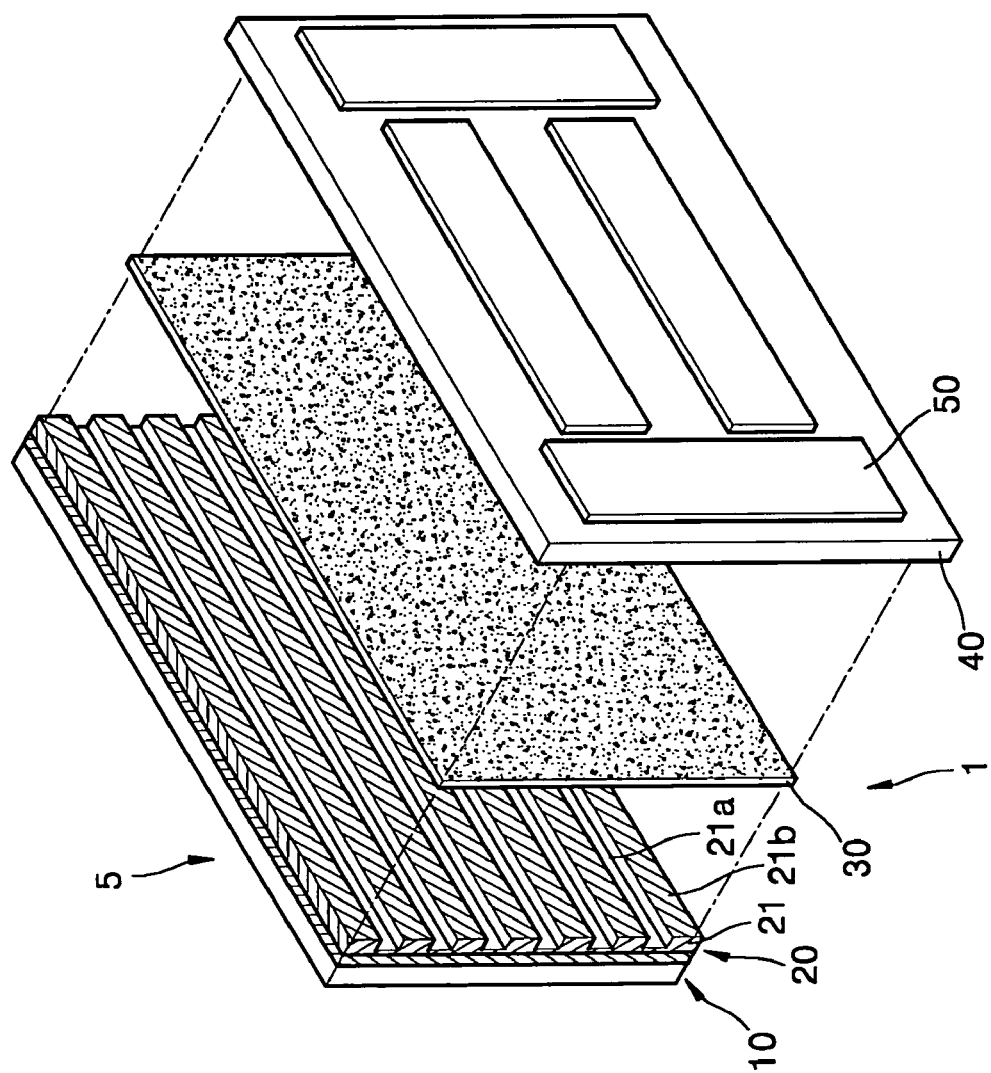
FIG. 2 is an exploded perspective view of a plasma display device, according to an embodiment of the present invention.

FIG. 2 is an exploded perspective view of a plasma display device, according to an embodiment of the present invention. Referring to FIG. 2, a plasma display device 1 includes a PDP 5, a chassis base 40, and a circuit portion 50. A heat dissipating sheet 30 can be interposed between the PDP 5 and the chassis base 40.

Figure 10:
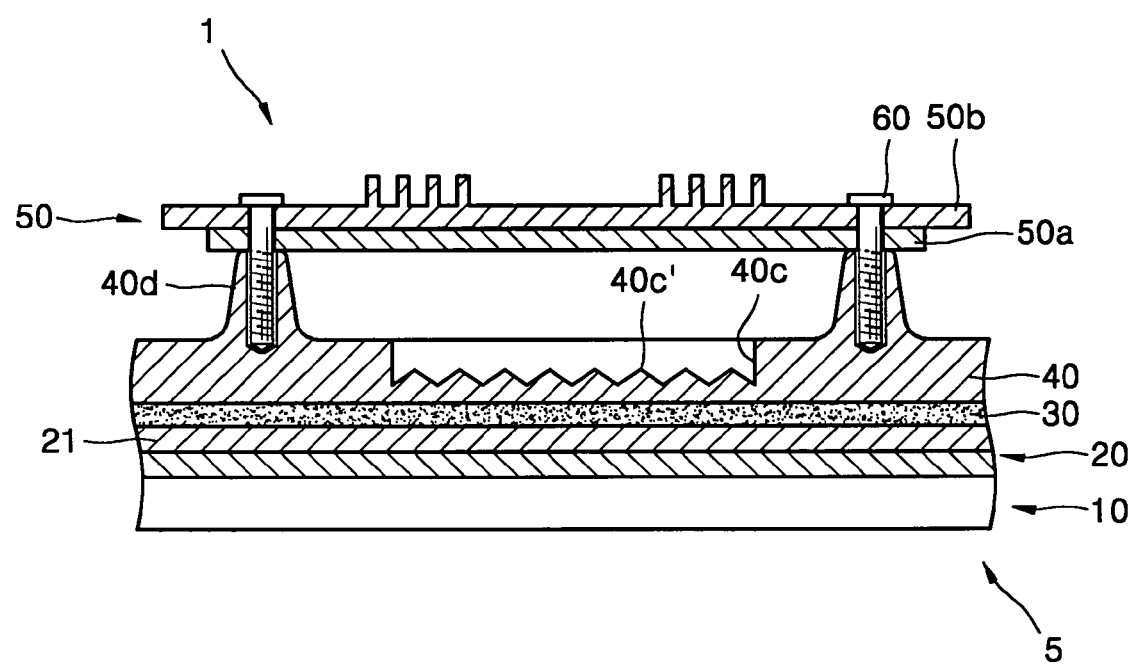
FIG. 10 is a cross-sectional view of a plasma display device, according to still another embodiment of the present invention.

The chassis base 40 includes uneven portions, such as bosses 40d of FIG. 10, or holes (not shown) through which wires pass, so that the circuit portion 50 is installed on a rear surface of the chassis base 40. Also, the chassis base 40 is formed of a material having a high heat conductivity, for example, aluminum, to serve as a heat dissipating substrate which promotes heat removal from the PDP 5 and the circuit portion 50. The chassis base 40 can be manufactured using a die casting method.

The circuit portion 50 includes circuit boards 50a of FIG. 10 which drive the PDP 5, and a circuit board cover 50b of FIG. 10 which is attached to rear surfaces of the circuit boards 50a.

The heat dissipating sheet 30 is interposed between the PDP 5 and the chassis base 40, conducts heat inside the PDP 5 to the chassis base 40, and serves as an adhesive for fixing the PDP 5 to the chassis base 40. Thus, the adhesive strength of the heat dissipating sheet 30 must be designed so as to endure the load of the PDP 5. The heat dissipating sheet 30 can be made of silicon glass, a silicon heat dissipating sheet, an acrylic thermally conductive pressure sensitive adhesive sheet, an urethane-based thermally conductive pressure sensitive adhesive sheet, or the like.

Figure 3:
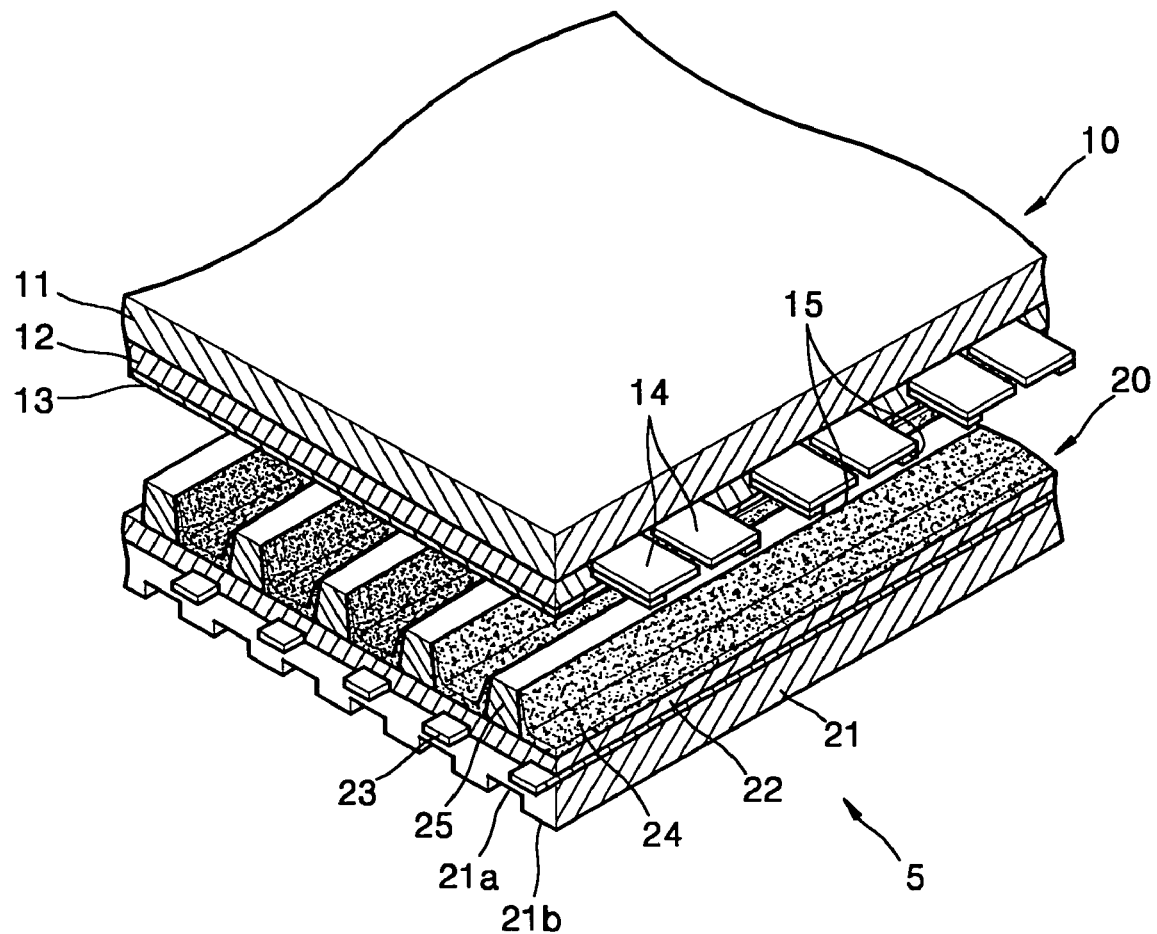
FIG. 3 is an exploded perspective view of a PDP of FIG. 2.

FIG. 3 is an exploded perspective view of the PDP 5 of FIG. 2. Referring to FIG. 3, the PDP 5 includes a front panel 10 and a rear panel 20 which are adhered to each other.

The front panel 10 includes a front substrate 11, discharge sustain electrodes 14, bus electrodes 15, a first dielectric layer 12, and a protection layer 13.

The front substrate 11 can be formed of glass, and the discharge sustain electrodes 14 can be formed of a plurality of pairs of predetermined patterns, e.g., stripe patterns, on the front substrate 11. The discharge sustain electrodes 14 can be transparent electrodes made of Indium Tin Oxide (ITO). The bus electrodes 15 are formed adjacent to the discharge sustain electrodes 14 to improve the electrical conductivity of such transparent electrodes. The bus electrodes 15 are made of a metal having a high electrical conductivity, such as silver, copper, or the like.

The first dielectric layer 12 is formed on the front substrate 11 to bury the discharge sustain electrodes 14 and the bus electrodes 15, and the protection layer 13 is formed on the first dielectric layer 12.

The rear panel 20 includes a rear substrate 21, address electrodes 23, a second dielectric layer 22, partition walls 25, and phosphors 24.

The rear substrate 21 can be made of glass like the front substrate 11.

The address electrodes 23 can be formed of a plurality of predetermined patterns, e.g., stripe patterns, on the rear substrate 21, and extend to be orthogonal to the discharge sustain electrodes 14.

The second dielectric 22 is formed on the rear substrate 21 to bury the address electrodes 23.

The partition walls 25 are formed on the second dielectric 22 to define a plurality of discharge cells, and can be stripe patterns which extend parallel with the address electrodes 23.

The phosphors 24 are red, green, and blue phosphors, for example, arranged by sides of the partition walls 25 on the second dielectric layer 22.

As shown in FIGS. 2 and 3, in the plasma display device 1 having the above-described structure, channels 21a through which air flows to perform air-cooling are formed on the rear substrate 21.

Figure 4:
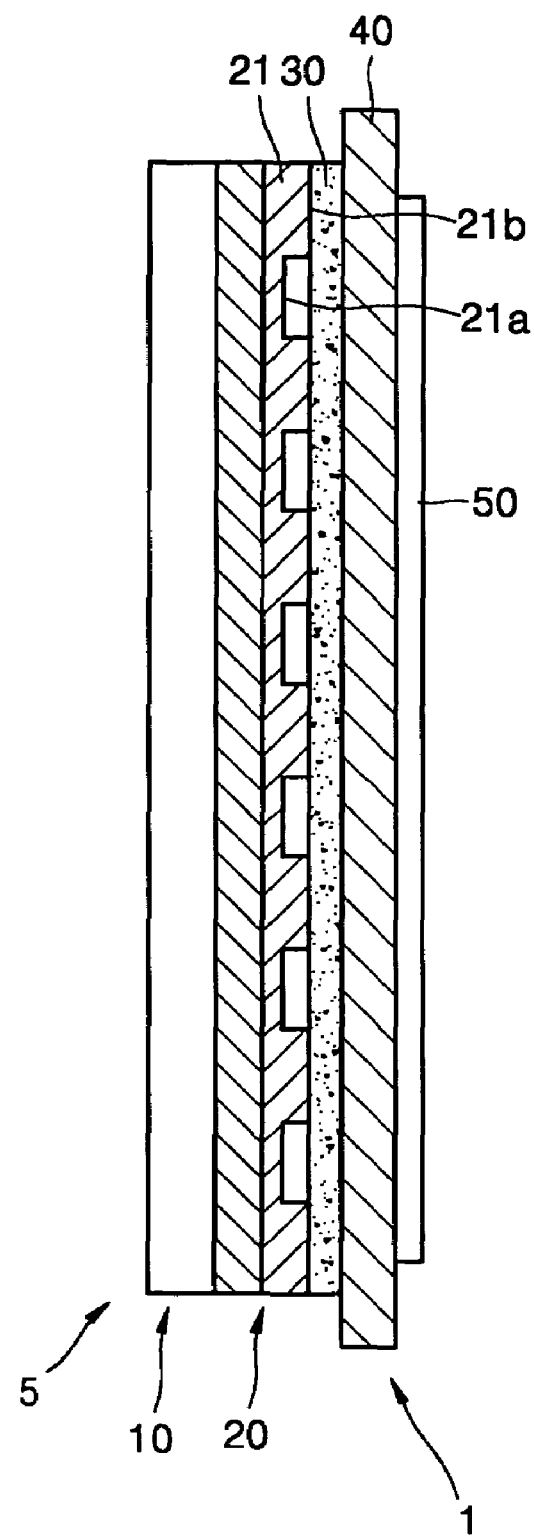
FIG. 4 is a cross-sectional view of the plasma display device of FIG. 2.

FIG. 4 is a cross-sectional view of the plasma display device 1 of FIG. 2. Referring to FIG. 4, the rear substrate 21 includes conductors 21b which contact the heat dissipating sheet 30 to conduct heat to the heat dissipating sheet 30 and the channels 21a which are spaced apart from the heat dissipating sheet 30 and through which air flows to remove heat.

The channels 21a and the conductors 21b can be formed as at least one groove in the rear substrate 21. Heat accumulated in the PDP 5 is externally dissipated by air-cooling and heat conduction performed by the heat dissipating sheet 30. In other words, heat generated inside the PDP 5 is externally dissipated via air which has flowed into the channels 21a of the rear substrate 21, and has flowed toward the chassis base 40 through the conductors 21b contacting the heat dissipating sheet 30.

Conduction and air-cooling efficiency can be improved to improve the heat removal efficiency. Therefore, the plasma display device 1 of an embodiment of the present invention can be manufactured as follows.

Figure 5:
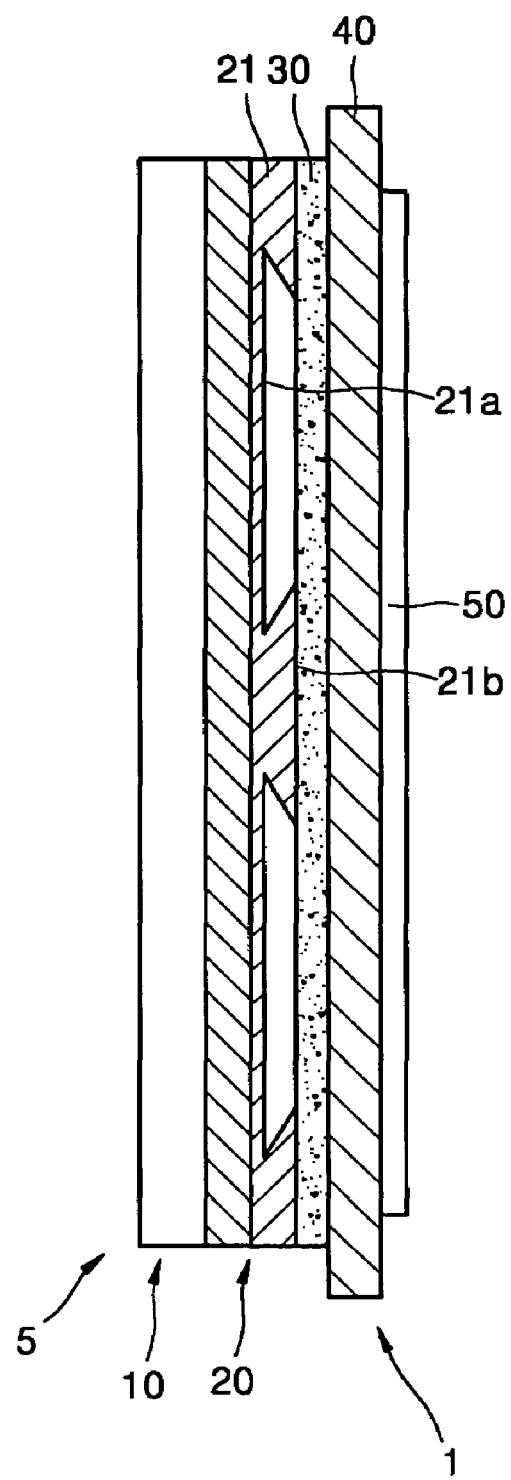
FIGS. 5 and 6 are cross-sectional views of a plasma display device, according to different embodiments of the present invention.

The area of the conductors 21b contacting the heat dissipating sheet 30 can be increased to improve the conduction efficiency. Thus, as shown in FIG. 5, sides of the channels 21a can be inclined.

Figure 6:
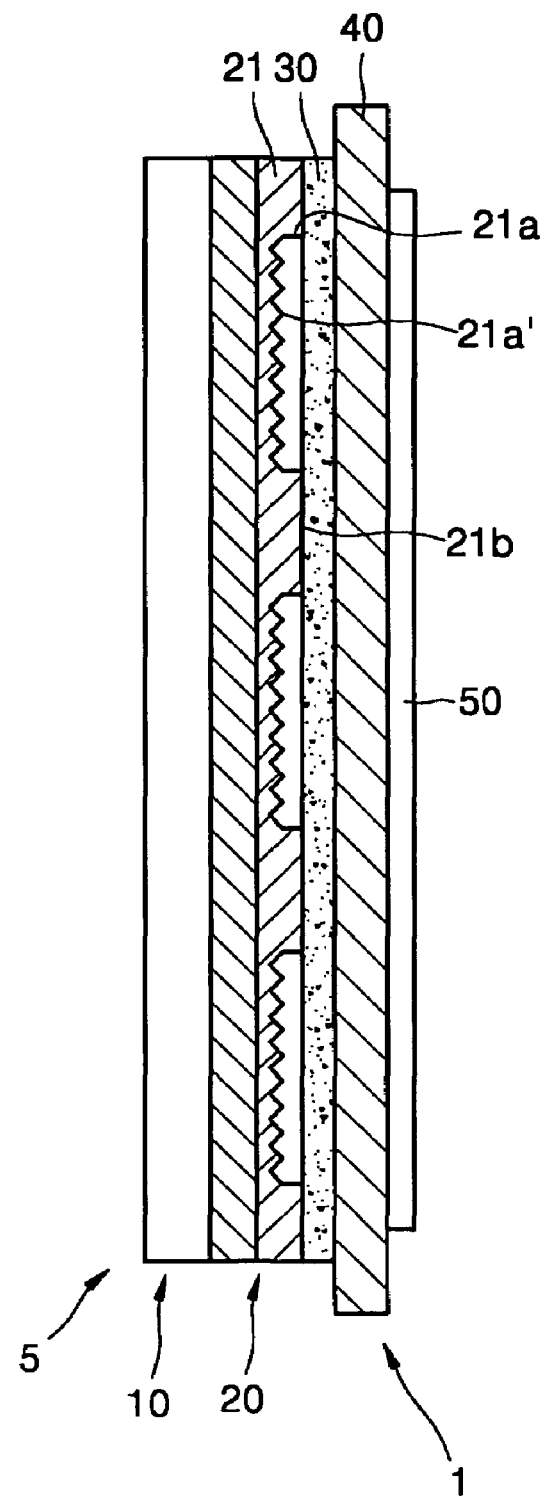

Also, the area of the channels 21a contacting air can be increased to improve the air-cooling efficiency. Thus, as shown in FIG. 6, the channels 21a can include area increasing portions 21a'. The area increasing portions 21a' can be uneven surfaces which are formed on the channels 21a. The area increasing portions 21a' can be formed on any surfaces of the channels 21a.

The channels 21a can be formed of various patterns that are preferably consecutively arranged to serve as air paths through which air smoothly flows in and out.

Also, it is preferable that the direction and size of the channels 21a are arranged so that the temperature of the PDP 5 is uniformly distributed. This will be explained with reference to FIGS. 7A through 7F.

Figure 7A:
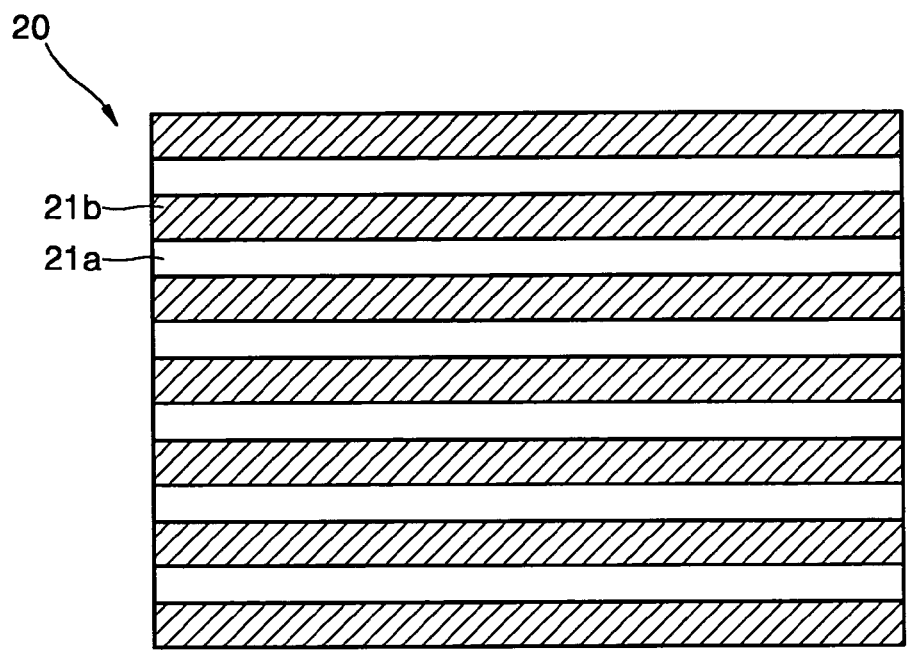
FIGS. 7A through 7F are views of patterns of channels of a plasma display device, according to different embodiments of the present invention.
Figure 7B:
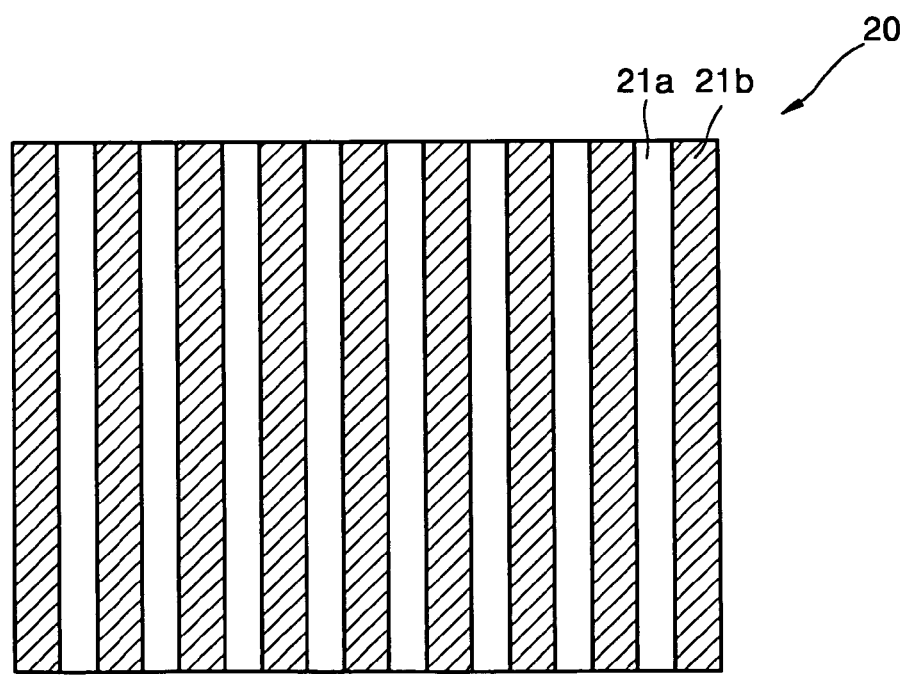

When the channels 21a are formed of stripe patterns as shown in FIGS. 7A and 7B, air flows in left and right directions or upward and downward directions in the rear panel 20. As a result, the temperature deviations of the rear panel 20 are substantially eliminated. In particular, when the channels 21a are formed of patterns shown FIG. 7B, air convection can occur during heat transmission from the rear panel 20 and thus quickly flow through the channels 21a. As a result, efficient heat removal can be achieved.

Figure 7C:
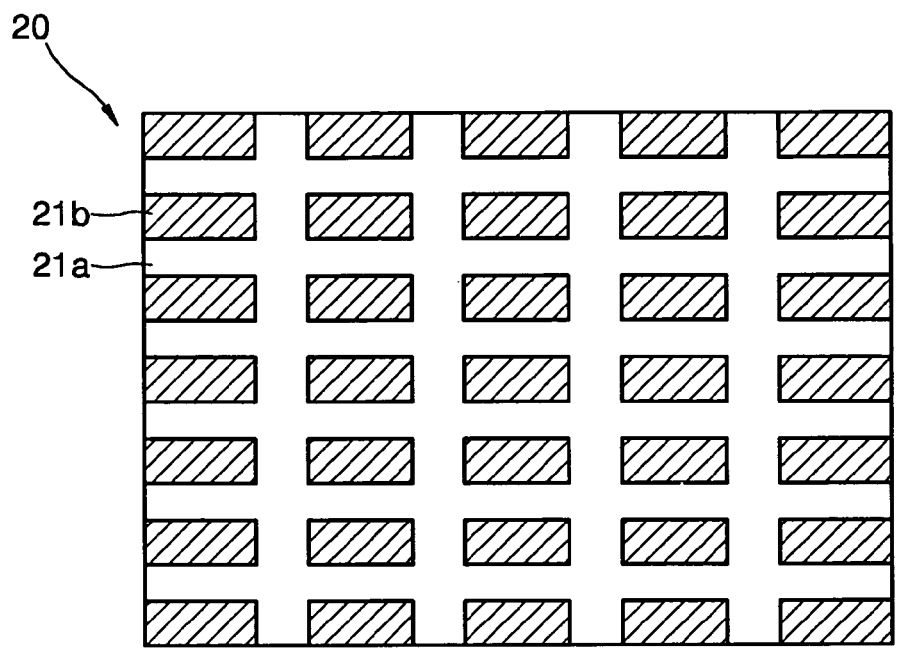

When the channels 21a are formed of lattices shown FIG. 7C, air can flow upward and downward and in left and right directions, which results in obtaining a further uniform temperature distribution.

Figure 7D:
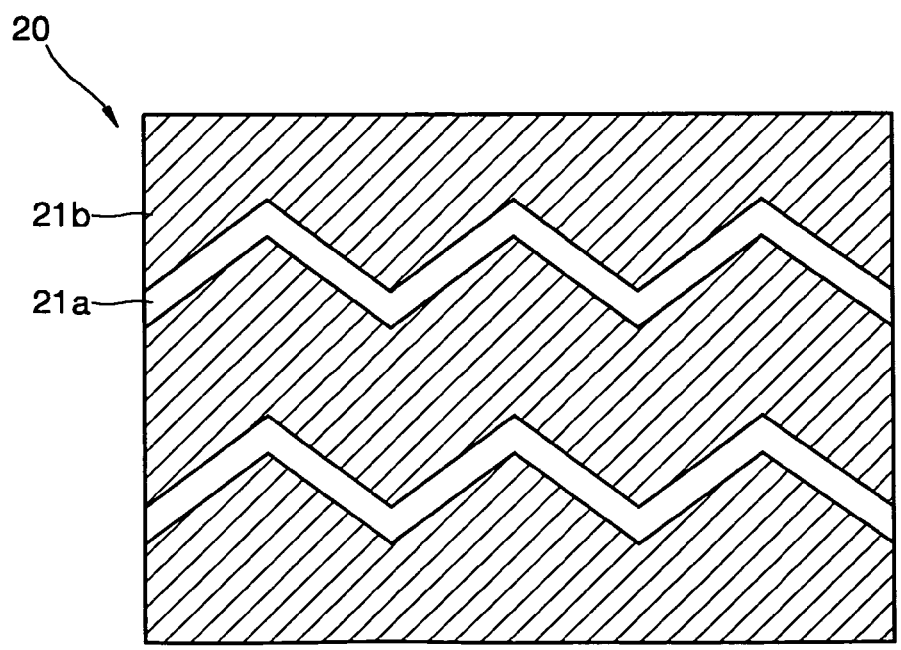
Figure 7E:
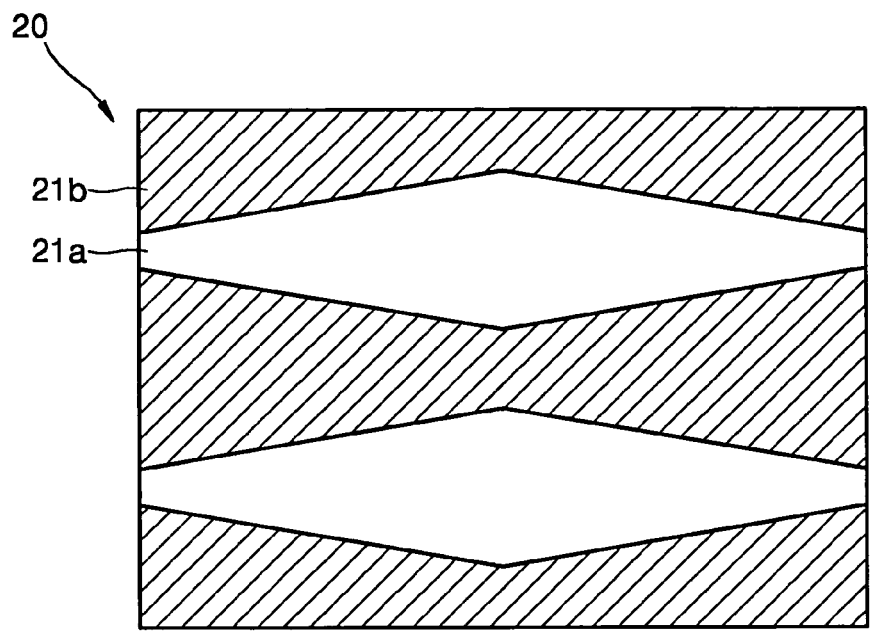

When the channels 21a are formed of serpentine or zigzag patterns shown in FIG. 7D, air can flow upward and downward and in left and right directions in the rear panel 20. As a result, the temperature of the PDP 5 can be uniformly distributed.

Such patterns can be determined in consideration of a degree of heat accumulation in each position of the PDP 5. When the channels 21a are formed in the patterns shown in FIG. 7E, a large amount of air can flow in a central portion of the PDP 5 in which a relatively large amount of heat has accumulated. As a result, heat flow can be promoted.

Figure 7F:
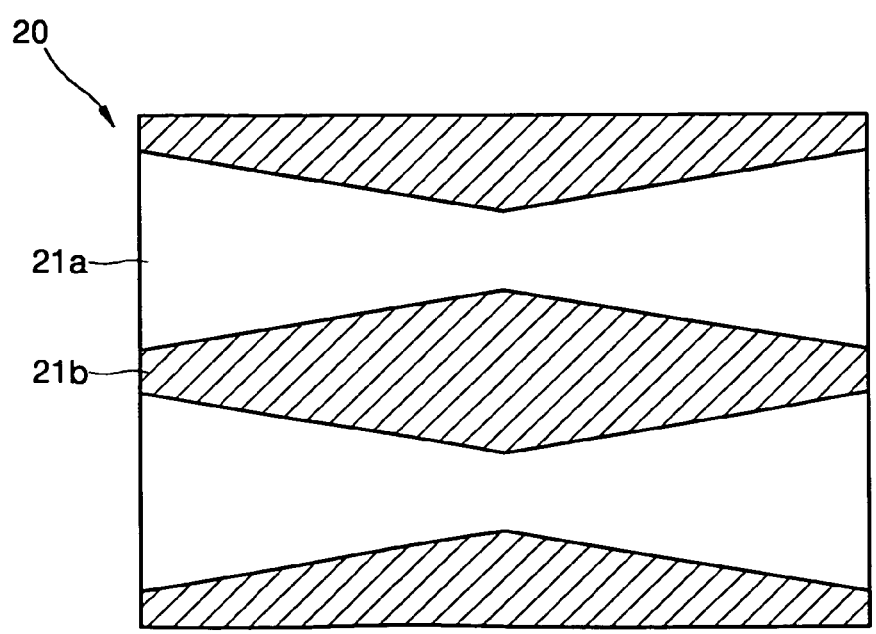

A cooling fan can be installed outside the PDP 5 to force air to flow. In this case, patterns can be formed in consideration of the installation position of the cooling fan. As shown in FIG. 7F, the size of air inlets of the channels 21a can be large so that a large amount of air flows into the channels 21a.

The channels 21a according to the present invention can attain the following effects.

As described above, when patterns of the channels 21 are appropriately designed, a non-uniform temperature distribution of the PDP 5 can be substantially eliminated. Therefore, the brightness differences caused by temperature deviations of the PDP 5 can be substantially eliminated, and the PDP 5 can be prevented from cracking due to heat stress.

Also, since the plasma display device 1 according to the present invention uses air-cooling and conduction methods to remove heat from the PDP 5, the amount of heat conducted to the chassis base 40 can be reduced so as to efficiently protect the circuit portion 50 installed on the chassis base 40.

The rear substrate 21 includes the channels 21a which do not contact the heat dissipating sheet 30 and through which air flows to conduct heat to the heat dissipating sheet 30, and the conductors 21b which contact the heat dissipating sheet 30 to conduct heat to the heat dissipating sheet 30 via heat conduction. Thus, the conductors 21b can contribute to improving heat conduction efficiency.

To be more specific, the surface of the chassis base 40 contacting the heat dissipating sheet 30 is not completely flat due to manufacturing limitations. According to the plasma display device 1 of the present invention, the channels 21a are formed so that not the entire surface of the rear substrate 21 but only the conductors 21b contact the heat dissipating sheet 30. Thus, the possibility that an air gap will be formed due to the uneven surface of the chassis base 40 is reduced. Also, since air discharge paths can be secured due to the channels 21a during a pressure bonding process, the air gap is filled with air which flows out through the air discharge paths. As a result, conduction efficiency can be improved.

Figure 8:
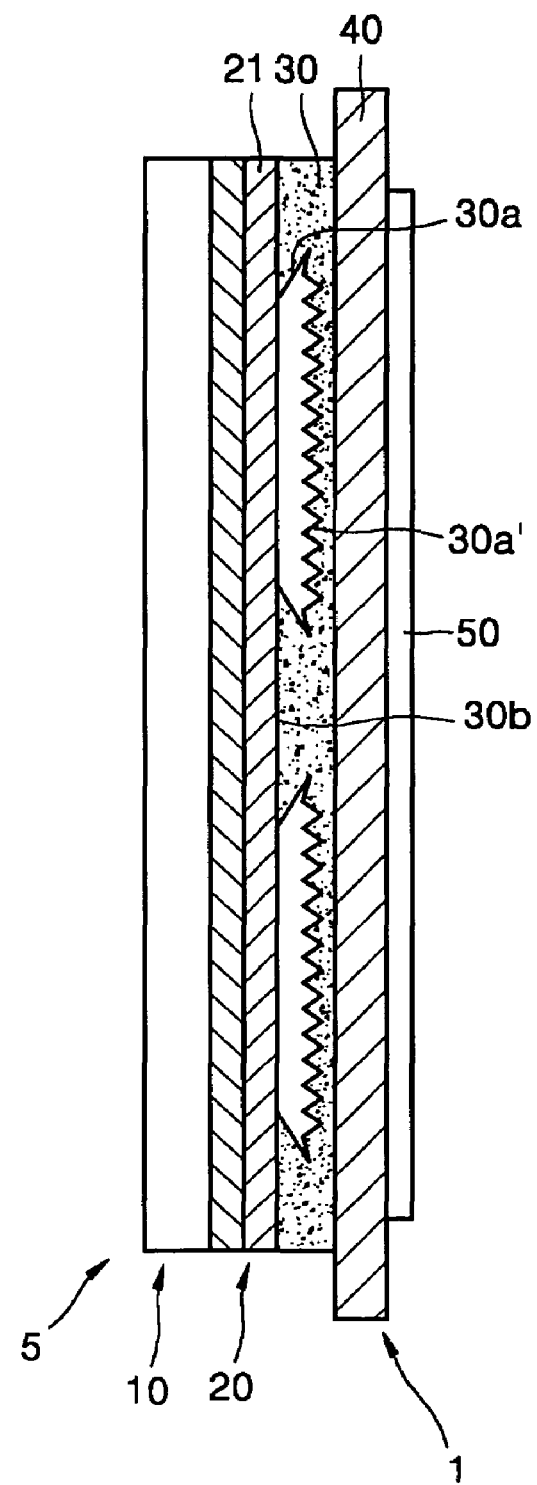
FIGS. 8 and 9 are cross-sectional views of a plasma display device, according to different embodiments of the present invention.

As shown in FIG. 8, the formation position of channels 30a is not limited to the rear substrate 21, but can be formed on the heat dissipating sheet 30 which contacts the rear substrate 21. The channels 30a are formed on a surface of the heat dissipating sheet 30 which contacts the rear substrate 21, but can be formed on a surface of the heat dissipating sheet 30 which contacts the chassis base.

The heat dissipating sheet 30 on which the channels 30a are formed can be manufactured by using various methods and materials. For example, to manufacture the heat dissipating sheet 30, a heatproof material such as a heatproof grease can be embedded in a heatproof base material such as polyurethane foam, pass through a channel-shaped roll, be heated, and hardened.

Alternatively, uneven surfaces can be formed of a thin aluminum substrate, coated with primer, and having a heatproof material adhered thereto. In this case, the thin aluminum substrate can contribute to improving heat conduction and reducing the temperature gradient of the PDP 5.

As shown in FIG. 8, the channels 30a can include inclined sides to improve conduction efficiency. Also, the channels 30a can include area increasing portions 30a' to improve air-cooling efficiency. The area increasing portions 30a' can be uneven surfaces which is included in the channels 30a, so as to enlarge the air-cooling area.

The channels 30a formed on the heat dissipating sheet 30 can be formed of various patterns as shown in FIGS. 7A through 7F.

Figure 9:
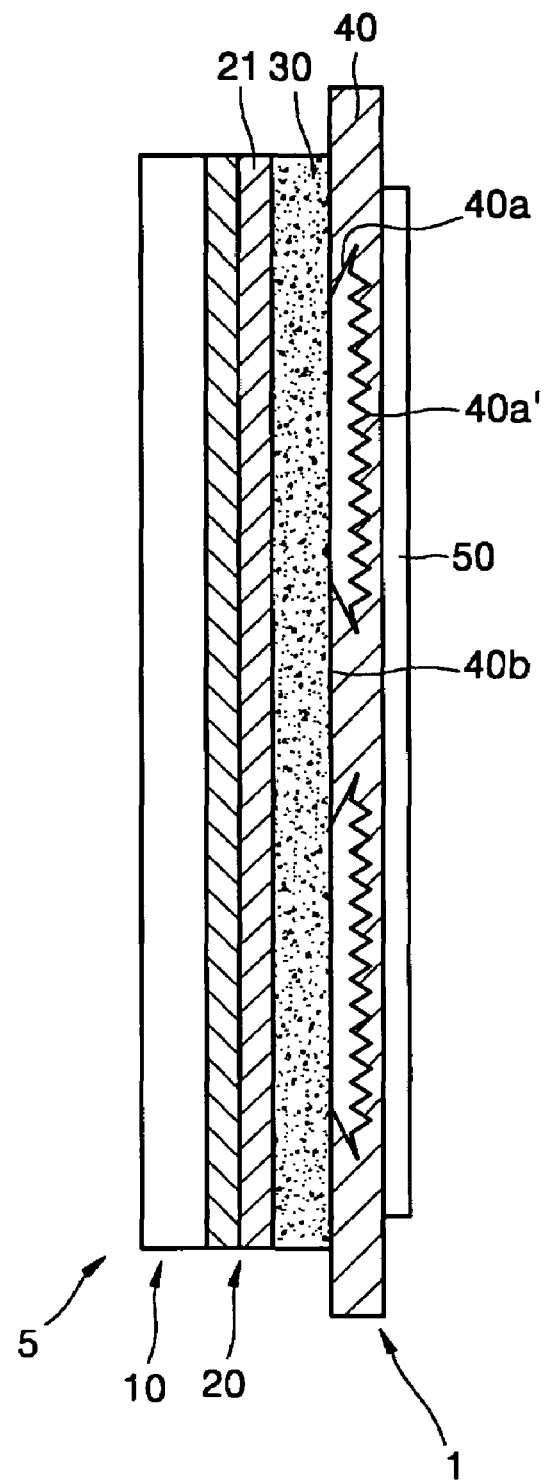

As shown in FIG. 9, channels 40a can be formed on a surface of the chassis base 40 which contacts the heat dissipating sheet 30. In a case where the channels 40a are formed on the chassis base 40, the channels 40a can contribute to reducing the temperature of the chassis base 40 so as to promote heat removal from the PDP 5 and the circuit portion 50 which is installed on the chassis base 40.

Referring to FIG. 9, the chassis base 40 can include inclined sides on which the channels 40a are to be formed, so as to have the same air-cooling area and increase the area contacting the heat dissipating sheet 30. In this case, heat conduction from the heat dissipating sheet 30 can be improved, which results in promoting heat removal from the PDP 5 bonded to the heat dissipating sheet 30.

The area of the channels 40a contacting air can be increased to improve heat transmission efficiency. Therefore, as shown in FIG. 9, the channels 40a can include area increasing portions 40a'. The area increasing portions 40a' can be uneven surfaces which are included in the channels 40a. The area increasing portions 40a' can be formed in various shapes on any side of the channels 40a.

Referring to FIG. 10, a channel 40c can be formed on a surface of the chassis base 40 which faces the circuit portion 50, to allow air to smoothly flow so as to efficiently achieve air-cooling. This will be described with reference to FIG. 10.

The chassis base 40 includes bosses 40d to fix a circuit board 50a of the circuit portion 50 to the rear surface of the chassis base 40. The circuit board 50a is disposed on upper surfaces of the bosses 40d. A circuit board cover 50b is installed on a rear surface of the circuit board 50a to protect the circuit board 50a from the heat. Screws 60 are combined with the bosses 40d to fix the circuit board 50a and the circuit board cover 50b to the chassis base 40.

The channel 40c is formed on the surface of the chassis base 40 which faces the circuit board 50, to induce the flow of air. The channel 40c serves to induce the smooth flow of air to efficiently achieve heat removal. In particular, when the cooling fan is used to force air to flow, heat removal efficiency can be further improved.

When the channel 40c is formed in the surface of the chassis base 40 which faces the circuit portion 50, the chassis base 40 and the circuit boards 50a of the circuit portion 50 are cooled by air flowing through the channel 40c. The channel 40c can be formed of various patterns as shown in FIGS. 7A through 7F. The channel 40c can be formed in consideration of the disposition of the circuit boards 50a. In other words, it is preferable that the channel 40c is designed so that air flows under or beside the circuit boards 50a to efficiently cool the circuit portion 50.

The channel 40c can be engraved or embossed. It is preferable that engraved or embossed patterns are consecutively formed in the channel 40c so that air smoothly flows in and out.

Also, the channel 40c can include the area increasing portions 40c' to improve air-cooling efficiency. The area increasing portions 40c' can be uneven surfaces which form the channel 40c. The area increasing portions 40c' can be formed on the entire surface of the channel 40c.

When the channel 40c is formed on the surface of the chassis base 40 which faces the circuit portion 50, the circuit portion 50 can be efficiently protected from the heat, and the temperature of the chassis base 40 can be reduced. As a result, heat removal from the PDP 5 can be promoted.

In the above-described embodiments, channels are formed on only one of a rear substrate of a PDP, a heat dissipating sheet, and a chassis base. However, it can be easily understood by one is of ordinary skill in the art that features of the present invention are applicable without limiting components on which the channels are formed and positions in which the channels are formed.

As described above, in a plasma display device according to the present invention, channels can be formed so that air flows into the plasma display device. Thus, heat removal from the plasma display device can be promoted, and the brightness characteristic of the plasma display device can be improved.

Also, the channels can be properly designed to uniformly distribute the temperature of a PDP. As a result, a brightness differences caused by a non-uniform temperature distribution can be substantially eliminated, and the PDP can be prevented from cracking due to heat stress.

Moreover, the adhesive strength of a heat dissipating sheet can be improved, which results in improving heat removal efficiency.

Furthermore, the amount of heat conducted to a chassis base can be reduced. As a result, a circuit portion installed on the chassis base can be prevented from being heated, and thus heat removal from the PDP can be promoted.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A plasma display device comprising:
   a plasma display panel including a front substrate and a rear substrate spaced apart from the front substrate to form a plurality of discharge spaces;
   a chassis base facing the plasma display panel; and
   at least one channel adapted to allow air to flow therethrough, the at least one channel arranged between the rear substrate and the chassis base.

2. The plasma display device of claim 1, further comprising a heat dissipating sheet interposed between the plasma display panel and the chassis base.

3. The plasma display device of claim 2, wherein the at least one channel is arranged between the rear substrate and the heat dissipating sheet.

4. The plasma display device of claim 3, wherein the at least one channel is arranged on a surface of the heat dissipating sheet facing the rear substrate.

5. The plasma display device of claim 2, wherein the at least one channel is arranged on a surface of the heat dissipating sheet facing the chassis base.

6. The plasma display device of claim 1, wherein the at least one channel is arranged on a surface of the rear substrate facing the chassis base.

7. The plasma display device of claim 1, wherein the at least one channel is arranged on a surface of the chassis base facing the plasma display panel.

8. The plasma display device of claim 1, wherein the at least one channel comprises at least one groove.

9. The plasma display device of claim 8, wherein the at least one groove is consecutively arranged to allow air to flow out.

10. The plasma display device of claim 8, wherein at least one side of the at least one groove is inclined at a predetermined angle with respect to a perpendicular direction of a surface on which the at least one groove is formed.

11. The plasma display device of claim 8, wherein the at least one groove is arranged in a serpentine or zigzag shape.

12. The plasma display device of claim 8, wherein a width of the at least one groove increases from an edge of a surface on which the at least one groove is arranged toward the center of the surface.

13. The plasma display device of claim 8, wherein the at least one groove is arranged in a predetermined pattern.

14. The plasma display device of claim 13, wherein the predetermined pattern is a stripe.

15. The plasma display device of claim 13, wherein the predetermined pattern is a lattice.

16. The plasma display device of claim 1, wherein at least one area increasing portion is arranged in the at least one channel to increase the surface area of the at least one channel.

17. The plasma display device of claim 16, wherein the at least one area increasing portion comprises an uneven surface.

18. A plasma display device comprising:
a plasma display panel including a front substrate and a rear substrate spaced apart from the front substrate to form a plurality of discharge spaces;
a chassis base arranged at the rear of the plasma display panel;
a circuit portion arranged at the rear of the chassis base; and
at least one channel adapted to allow air to flow therethrough, the at least one channel arranged on the rear surface of the chassis base.

19. The plasma display device of claim 18, wherein the at least one channel comprises at least one groove.

20. The plasma display device of claim 19, wherein the at least one groove is consecutively arranged to allow air to flow in and out.

21. The plasma display device of claim 19, wherein the at least one groove is arranged in a serpentine or zigzag shape.

22. The plasma display device of claim 19, wherein a width of the at least one groove increases from an edge of the chassis base toward the center of the chassis base.

23. The plasma display device of claim 19, wherein the at least one groove is arranged in a predetermined pattern.

24. The plasma display device of claim 23, wherein the predetermined pattern is a stripe.

25. The plasma display device of claim 23, wherein the predetermined pattern is a lattice.

26. The plasma display device of claim 18, wherein area increasing portions are arranged in the at least one channel to increase the surface area of the at least one channel.

27. The plasma display device of claim 26, wherein the area increasing portions comprise uneven surfaces.

* * * * *